United States Patent [19]

Zhang et al.

[11] Patent Number: 5,506,175

[45] Date of Patent: Apr. 9, 1996

[54] METHOD OF FORMING COMPOUND STAGE MEM ACTUATOR SUSPENDED FOR MULTIDIMENSIONAL MOTION

[75] Inventors: Z. Lisa Zhang; Noel C. MacDonald, both of Ithaca, N.Y.

[73] Assignee: Cornell Research Foundation, Inc., Ithaca, N.Y.

[21] Appl. No.: 443,331

[22] Filed: May 17, 1995

Related U.S. Application Data

[62] Division of Ser. No. 69,725, Jun. 1, 1993.

[51] Int. Cl.[6] .................................................. H01L 21/465
[52] U.S. Cl. ........................ 437/228; 437/901; 437/927
[58] Field of Search ..................... 437/927, 901, 437/921, 228; 148/DIG. 73, DIG. 159; 313/336, 308.311

[56] References Cited

U.S. PATENT DOCUMENTS

| | | | |
|---|---|---|---|
| 3,755,704 | 8/1973 | Spindt et al. | 313/309 |
| 3,835,338 | 9/1974 | Martin | 310/331 |
| 4,095,133 | 6/1978 | Hoeberechts | 313/336 |
| 4,437,226 | 3/1984 | Soclof | 437/55 |
| 4,520,570 | 6/1985 | Bednorz et al. | 33/61 |
| 4,668,865 | 5/1987 | Gimzewski et al. | 250/306 |
| 4,670,092 | 6/1987 | Motamedi | 156/643.1 |
| 4,706,374 | 11/1987 | Murakami | 437/225 |
| 4,721,885 | 1/1988 | Brodie | 313/576 |
| 4,766,340 | 8/1988 | van der Mast et al. | 313/366 |
| 4,776,924 | 10/1988 | Delapierre | 156/647.1 |
| 4,845,048 | 7/1989 | Tamaki et al. | 437/62 |
| 5,057,047 | 10/1991 | Greene et al. | 445/24 |
| 5,063,323 | 11/1991 | Longo et al. | 313/309 |
| 5,229,682 | 7/1993 | Komatsu | 313/309 |
| 5,235,187 | 8/1993 | Arney et al. | 250/306 |
| 5,378,658 | 1/1995 | Toyoda et al. | 437/228 |

FOREIGN PATENT DOCUMENTS

| | | |
|---|---|---|
| 0497509 | 8/1992 | European Pat. Off. . |
| 53-136982 | 6/1988 | Japan . |
| WO8909479 | 10/1989 | WIPO . |

OTHER PUBLICATIONS

Busta et al., "Triode Operation of a Vacuum Transistor", Amoco Technology Company, Naperville, IL, 1991, IEEE.
Theodore et al., "TEM Characterization of Defect Configurations in Submicron SOI Structures", published Apr. 1989.
Zhang et al., "An RIE Process for Submicron, Silicon Electromechanical Structures", published May 24, 1991.
Arney et al., "Formation of Submicron Silicon-on-Insulator Structures by Lateral Oxidation of Substrate-Silicon Islands", J. Vac. Sci. echnol. B. 6 (1), Jan./Feb. 1988, pp. 341–345.

*Primary Examiner*—George Fourson
*Assistant Examiner*—H. Jey Tsai
*Attorney, Agent, or Firm*—Jones, Tullar & Cooper

[57] ABSTRACT

A microelectromechanical compound stage microactuator assembly capable of motion along x, y, and z axes for positioning and scanning integrated electromechanical sensors and actuators is fabricated from submicron suspended single crystal silicon beams. The microactuator incorporates an interconnect system for mechanically supporting a central stage and for providing electrical connections to components of the microactuator and to devices carried thereby. The microactuator is fabricated using a modified single crystal reactive etching and metallization process which incorporates an isolation process utilizing thermal oxidation of selected regions of the device to provide insulating segments which define conductive paths from external circuitry to the actuator components and to microelectronic devices such as gated field emitters carried by the actuator.

3 Claims, 7 Drawing Sheets

METHOD OF FORMING COMPOUND STAGE MEM ACTUATOR SUSPENDED FOR MULTIDIMENSIONAL MOTION

This is a divisional of copending application Ser. No. 08/069,725 filed on Jun. 1, 1993.

BACKGROUND OF THE INVENTION

This invention was made with government support under Contract No. DABT-63-92-C-0019 awarded by the Advanced Research Projects Agency (ARPA). The government has certain rights in the invention.

The present invention relates, in general, to compound stage microelectromechanical (MEM) devices for multidimensional motion, and more particularly to MEM sensors and microactuators having multiple suspended stages interconnected by way of multiple beams to permit selective activation of the stages for controlled motion in three dimensions, and to such devices incorporating microelectronic components, such as gated field emitters. The invention further relates to methods for fabricating compound micron-dimensioned devices for selective control thereof and for fabricating gated field emitters integrally therewith.

Microelectromechanical devices have been developed for a variety of purposes, and are exemplified by U.S. Pat. Nos. 5,072,288, 5,198,390, 5,179,499, and 5,199,917, all issued to MacDonald et al and assigned to the assignee of the present application, as well as by the article entitled "A RIE Process for Submicron Silicon Electromechanical Structures" Zhang et al, J. Micromech. Microeng., Volume 2, No. 1, March 1992, pages 31–38. Various processes and techniques have been developed for production Of such devices, as described in the Zhang et al publication, and these devices and processes have created a new technology for micron and submicron devices.

Fundamental to the application of MEM techniques to micromachined systems and instruments, however, is the provision of microactuators capable of supporting various microelectronic devices and components to enable them to be moved or held in place selectively and with great precision. Particularly needed is a way to position microactuators about three linear (x, y, z) and three angular (roll, pitch, yaw) directions. Such six-way positioning must have a wide range of travel, must operate with speed and high resolution, must be repeatable, and must have the capacity to move a significant load, as well as to provide accurate position readouts, so as to provide accurate positioning as well as scanning operations. Furthermore, to enable such actuators to carry microelectronic devices, a mechanism must also be provided for electrically connecting the microelectronics to exterior circuitry.

SUMMARY OF THE INVENTION

It is, therefore, an object of the present invention to provide a compound stage MEM device capable of supporting microelectronic components and further capable of providing electrical connections between such components and exterior circuitry.

A further object of the present invention is to provide a microactuator device capable of motion in six directions and of carrying and positioning electronic components.

A still further object of the invention is to provide a microelectromechanical structure having compound stages, electrical interconnections between the stages and components carried by the stages, and to provide a process for fabricating the same.

Another object of the invention is to provide mechanically connected, electrically isolated silicon suspended beam structures for positioning and scanning integrated micromachined optical and electronic devices.

Still another object of the invention is to provide a compound stage microactuator fabricated from multiple suspended silicon beams mechanically interconnected and incorporating electrically isolating segments to provide multiple paths for addressing integrated emitter tips, gate electrodes, actuators, and sensors.

A further object of the invention is to provide a method of fabricating a microactuator incorporating multiple interconnected suspended silicon beams having integrated metal electrodes for electrical actuators and incorporating integral oxide insulators, and to a process for fabricating gated field emitters on such suspended beams.

Briefly, the present invention is directed to a microelectromechanical compound stage microactuator and to an interconnect system for mechanically supporting a central stage and for providing electrical connection paths to devices carried by the actuator. The microactuator is fabricated using a modified and extended single crystal reactive etching and metallization process (SCREAM) of the type described in U.S. Pat. No. 5,198,390, but including an isolation process utilizing thermal oxidation of selected regions of the MEM structure interconnect system to provide defined conductive paths from external circuitry to various selected actuator components and to microelectronic devices carried by the actuator.

The central stage is mounted in a frame support assembly which includes first, second, and third interconnected, coplanar, concentric frame stages. The central stage is fixed to, and moves with, the first frame stage which, in turn, is mounted within and is movable with respect to the second frame stage. This mounting is by means of second stage x-axis and y-axis connectors which interconnect the frames and provide the relative motion, for example along an x-axis lying in the plane of the microactuator structure and passing through the center of the central stage. The y-axis connectors which secure the first frame stage within the second frame are a plurality of spaced elongated springs which extend parallel to the y-axis of the assembly and are flexible in the x direction. The x-axis connectors are drivers, such as comb-shaped capacitors, for producing motion of the first frame stage, and its connected central stage, along the x-axis with respect to the second stage frame, when the drivers are activated. This first frame stage may be referred to as the x stage.

The second frame stage is mounted within a third frame stage by third stage x-axis and y-axis connectors which provide relative motion of the second frame with respect to the third frame, for example along the y-axis. The third frame stage x-axis connectors are a plurality of elongated, spaced springs parallel to the x-axis and flexible in the y direction. The y-axis connectors are drivers for producing y-axis motion of the first and second frame stages and the central stage with respect to the third frame stage, when the drivers are activated. This second frame stage may be referred to as the y stage.

The third frame stage is suspended within a substrate cavity by a plurality of spaced, elongated x-axis and y-axis suspension beams, the inner ends of which are connected to the third frame, and the outer ends of which are connected to silicon-on-insulator (SOI) structures on a surrounding substrate. These SOI structures clamp the assembly to the substrate, while electrically insulating it from the substrate, and permit electrical connections from the beams to corresponding contact pads on the substrate. The suspension beams are used as mechanical cantilevered supports and as electrical interconnects to address the actuator drivers, sensor and feedback electrodes, and integrated components, such as gated field emitters, carried by the actuator. These beams are flexible vertically, the vertical flexibility allowing motion of the third frame in the z direction, perpendicular to the x-y plane of motion of the first and second frames.

Each of the support frames is fabricated from multiple single crystal silicon (SCS) beams fabricated from the silicon substrate, and are submicron scale structures nominally 300–800 nm wide and 2–4 micrometers thick, after completion of the fabrication process, including a silicon dioxide layer conformally covering them. Isolating segments having thin cross-sections are provided in the SCS beams so that during the fabrication process the oxidation step which produces the silicon dioxide coating also produces complete oxidation of the beams in such segments to thereby provide spaced electrical insulator segments at selected locations along the beams. The multiple beams of each of the frames are interconnected by bridges which may either be conductive to provide electrical connections between adjacent beams, or may be fabricated with thin cross sections in selected locations for oxidation to provide insulating support structures between adjacent beams, as required for the interconnect system. By carefully selecting the location of such insulator segments and bridges, conductive interconnect paths through the multiple frame beams are provided.

The relative displacements of the first and second stages and the second and third stages produce corresponding x and y displacements of the central stage, and this motion can be driven, sensed, and controlled by drivers such as the comb-shaped capacitive electrodes integrated in the stages. An electrical potential difference can be applied between the outermost or third frame stage and electrodes on the floor of the cavity to provide motion in the z direction, so the third frame may be referred to as the z stage. Rotational motion about the z axis of the actuator (yaw) can be controlled or restricted by the provision of electrical potential differences between corners of the outermost frame stage and the surrounding walls of the silicon substrate. Similarly, pivotal motion about the x and y axes (pitch and roll) can be provided or controlled by the application of potential differences between segments of the frame stages and selected electrodes surrounding the frame stages or on the floor of the cavity. Accordingly, multidimensional motion of the actuator can be precisely controlled with applied drive, sense, and feedback signals.

The microactuator of the present invention offers capabilities which are useful for high resolution, 3-dimensional accelerometers, sensors, and positioning and scanning instruments. The actuator device has excellent resistance to thermal interference because the mechanical and physical properties of the single crystal silicon material. The stage-within-a-stage scheme provides simultaneous x, y, and z motions, while the multiple beam structure of the frames resists stage twist or torsion. The displacement of the center stage is highly precise because the drive, sense, and feedback electrodes used to control it are integrated into the suspended and movable composite stage and are controlled by selected electrical potentials. The bridges which mechanically interconnect the circumferential beams of the frames provide electrical connections, but can be oxidized to provide electrical insulation while maintaining mechanical strength, and the multiple interconnections to the surrounding substrate allow selective addressing of the various components integrated into the assembly.

In a preferred form of the invention integrated microdynamic emission cathodes are provided on the central stage of the actuator and are mechanically positioned and scanned by the compound x, y, z stages. The invention also includes a process for fabricating such emitters which is fully integrated with the extended SCREAM process for fabricating the single crystal beams and insulators for the microactuator, as well as with the process for making the silicon-on-insulator connections between the actuator and the substrate. The process enables emitters to be formed on released silicon beams, with the emitters having tips and gates fully self-aligned with each other and with the beams to permit fabrication of large, dense arrays of such emitters.

As indicated above, the actuator assembly of the present invention is fabricated utilizing a silicon single crystal reactive etching metallization process integrated with beam-to-beam isolation and beam-to-substrate isolation processes.

BRIEF DESCRIPTION OF THE DRAWINGS

The foregoing, and additional objects, features, and advantages of the present invention will become apparent to those of skill in the art from a consideration of the following detailed description of a preferred embodiment, taken in conjunction with the accompanying drawings in which.

DESCRIPTION OF PREFERRED EMBODIMENT

In accordance with one embodiment of the invention, a compound stage actuator 10 is fabricated from a single crystal silicon substrate 12 as a released, cantilevered structure within a cavity 14 formed in the substrate. The released structure 10 includes a central stage portion 16 connected to a multistage support assembly 18 which holds the central stage above the floor 20 of the cavity for 6-way motion in x, y, z, roll, pitch, and yaw directions. This central stage portion 16 may incorporate microelectronic devices such as cathode emitters 22, capacitor plates, sensors or the like, which preferably are fabricated using the SCREAM process (to be described) or a process compatible with it, at the same time the remainder of the structure is formed. Alternatively, microelectronic devices or the like can be fabricated after completion of the stage and support structures. The multi-stage support assembly 18 provides an interconnect system which connects external signal sources or receivers (not shown), which may be incorporated in substrate 12, to selected components, such as emitters 22, carried by the central stage portion 16 as well as to components of the support assembly for use in control or sensing operations. The interconnect system uses parts of the support assembly itself as the electrically conductive elements, with suitable insulating segments being provided to define specific signal paths through the assembly. These insulating segments provide mechanical connections between various components of the structure to provide structural integrity while providing electrical isolation between adjacent parts to permit complex interconnection schemes.

The central stage portion 16 (FIG. 2) is supported mechanically within a first support frame stage 24 which includes a frame comprising a released beam 26 surrounding the stage 16 and spaced above the floor 20 of the cavity 14 in the substrate 12. The central stage 16 is fixedly secured within this first, innermost beam, or frame 26 so that they move together. In a preferred form of the invention, the frame 26 is rectangular, including opposite sides 28, 30, and 32, 34 surrounding the central stage portion 16, and is coplanar therewith.

Figure 2:
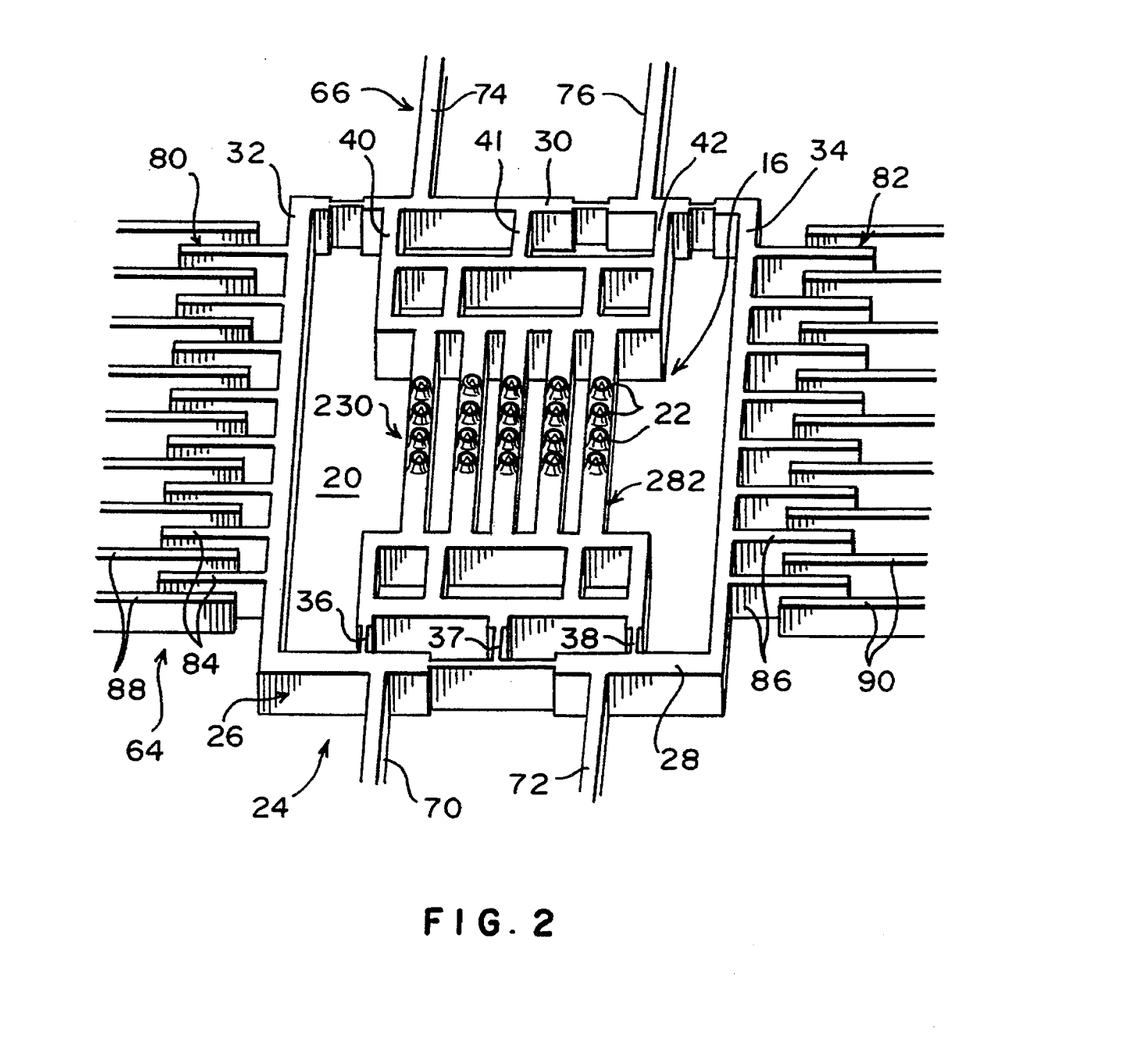
FIG. 2 is an enlarged partial view of the central stage and a first frame stage of the assembly of FIG. 1.

The first support frame stage 24 includes a plurality of interconnect beams 36–38 and 40–42 extending inwardly from the frame sides 28 and 30, respectively, to secure the central stage 16 in place. The beam 26 extends circumferentially around the central stage and provides a rigid support frame which will not twist under applied forces, to thereby permit precision positioning of the central stage. The beam 26 forming the frame preferably is fabricated with a high aspect ratio for stiffness in the vertical direction. Although illustrated as a single beam, it will be understood that frame 24 may incorporate plural parallel circumferential beams, with adjacent beams being interconnected by bridges to further increase frame rigidity and to provide electrical connection between adjacent circumferential beams in the manner described below for the outer frames.

This first support frame stage 24 is mounted within a second, or intermediate support frame stage 50 which preferably is constructed of plural, parallel released beams such as beams 52–54 (FIG. 3), circumferentially surrounding and spaced from the first frame 24 and coplanar therewith. The second frame stage 50 is preferably rectangular, with its edges 56, 58 and 60, 62 being parallel to and spaced from corresponding edges 28, 30 and 32, 34 of the first frame beam 26. The first frame 26 is mounted to the second frame by x-axis and y-axis connectors 64 and 66, respectively, which support the first frame for motion along one axis with respect to the second frame. In the illustrated example, the first frame stage 24 is supported for motion along an x-axis 68 passing through the center of the central stage 16.

Furthermore, in the illustrated embodiment the y-axis connectors 66 of the second frame stage 50 are in the form of elongated springs 70, 72 and 74, 76, which are released beams extending parallel to the y-axis 78 of the device and connected at their opposite ends to corresponding edges of the first and second frames 24 and 50. These y-axis spring beams are laterally flexible to allow the frame 24 to move along the x-axis with respect to frame 50.. Preferably these spring mounting beams have high aspect ratios so that they are flexible in the x direction, but are substantially inflexible in the z direction, which is perpendicular to the plane of the device, so that motion of stage frame 24 with respect to the stage frame 50 is constrained to the x-y plane of the first frame 24 along the x-axis. Motion of the central stage 16 follows that of stage 24.

Motion of stage 24 with respect to stage 50 is produced by, and may be sensed by, comb-type drive capacitors 80 and 82 having first plates 84 and 86 extending outwardly from opposite sides 32 and 34, respectively, of stage 24 and interleaved with second plates 88 and 90 extending inwardly from corresponding opposed edges 60 and 62 of the frame 50. The plates 84 and 88, and plates 86 and 90 are interleaved so that the application of potentials across the respective drive capacitor 80 and 82 produces corresponding controlled motion in the x direction, or in the alternative, potentials across these plates can be measured to determine the location of the inner frame 24 with respect to frame 50.

Frame stage 50 is, in turn, mounted to an outermost frame stage 100 which is similar in structure to that of frame 50 and thus is comprised of plural, parallel, mechanically interconnected, released beams 102, 103, and 104 extending circumferentially around and spaced from the inner frame 50. The outer frame stage 100 thus is concentric with the inner frames 24 and 50 and with the central stage 16, and preferably is rectangular, with sides 106, 108 and 110, 112 being parallel to corresponding sides 56, 58 and 60, 62 of the inner frame 50. Because of its interconnected multiple beam structure, the frame 100 is sufficiently rigid to resist twisting. The plural beams provide multiple electrical paths for use in interconnecting the drive capacitors and the stage microelectronics to external circuitry, as will be described.

The inner frame 50 is mounted to the outer frame 100 by means of plural, coplanar x-axis spring beam connectors 114–117 and 120–123 which are flexible in the y direction to permit relative y-axis motion between the inner and outer frames. Motion along the y-axis is produced by comb-type capacitors 126 and 128 connected between corresponding sides 56, 106 and 58, 108 of the inner and outer frames 50 and 100, respectively. Each drive capacitor includes two sets of interleaved plates, one set (130 or 132) being connected to a corresponding inner frame edge (56 or 58) and the other set (134 or 136) being connected to a corresponding outer frame edge (106 or 108) so that the application of a potential across the capacitors produces motion of frame 50 with respect to the outer frame 100 along the y-axis.

Frame 100 is suspended within cavity 14 formed in substrate 12 by means of cantilevered, released, coplanar suspension beams 140–142 and 144–146 extending between ends 106 and 108 of frame 100 and corresponding edges 150 and 152 of the surrounding substrate. Similarly, suspension beams 154–157 and beams 160–163 extend between frame edges 110 and 112 and corresponding edges 164 and 165 of the substrate 12. These suspension beams hold the frame 100 in the x-y plane, securing it against motion along either the x or y axis. However, the outer frame 100 is capable of motion in the z direction, perpendicular to the plane of the frame, toward and away from the substrate cavity floor 20. This motion may be under the control of a potential applied between a conductive layer on the floor 20 of cavity 14 and corresponding conductive beams on the movable frame stage 100, since the suspension beams 154–157 and 160–163 can flex in the vertical direction.

Furthermore, all of the suspension beams connecting the frame 100 to the surrounding substrate can flex vertically to allow rotational motion of the outer frame 100 with respect to the substrate and around the z axis, which is perpendicular to the xy plane. This allows the entire actuator assembly 10 to be moved in clockwise or counterclockwise directions in the x-y plane. Such rotational, or yaw motion, can be produced by means of potentials applied across conductive beam segments at the corners of frame 100 and adjacent capacitive plates (indicated by dotted lines 166) on adjacent walls of cavity 14. Furthermore, by providing a conductive layer on the cavity floor, and dividing the floor conductive layer into segments; for example, into four quadrants 168 a, b, c, and d indicated by dotted lines, and by application of potentials between selected quadrants and parts of the movable frame 100, controlled pivotal motion about either the x or the y axis can be produced for pitch and roll motion of the central stage 16.

Figure 1:
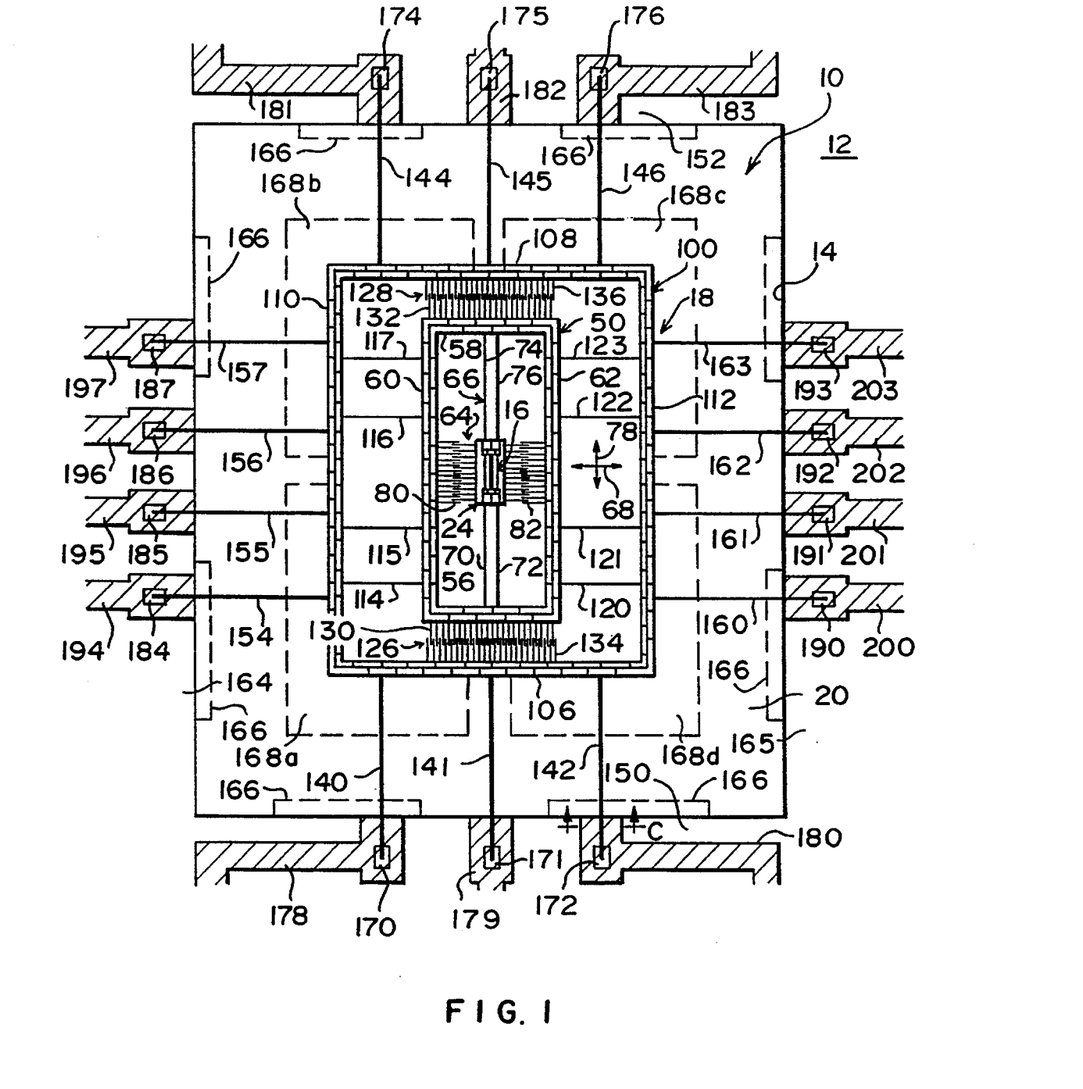
FIG. 1 is a diagrammatic top plan view of a compound stage microactuator constructed in accordance with the present invention.

The suspension beams are secured at their outer ends to corresponding connectors fabricated by a silicon on insulation (SOI) process whereby electrical connections can be made to the beams from external circuitry by way of contact pads and suitable conductors formed on the substrate. As illustrated in FIG. 1, suspension beams 140–142 are connected to connector pads 170–172, respectively and beams 144–146 are connected to pads 174–176, respectively, through SOI connections, with each of the pads then being electrically connected by way of corresponding conductors 178–180 and 181–183 to control or sensing circuits (not shown) which may be incorporated in the substrate 12 or may be external thereto. Similarly, the outer end of beams 154–157 and 160–163 are connected through corresponding SOI connections, pads 184–187 and 190–193 and conductors 194–197 and 200–203 to respective control or sensing circuits.

Figure 3:
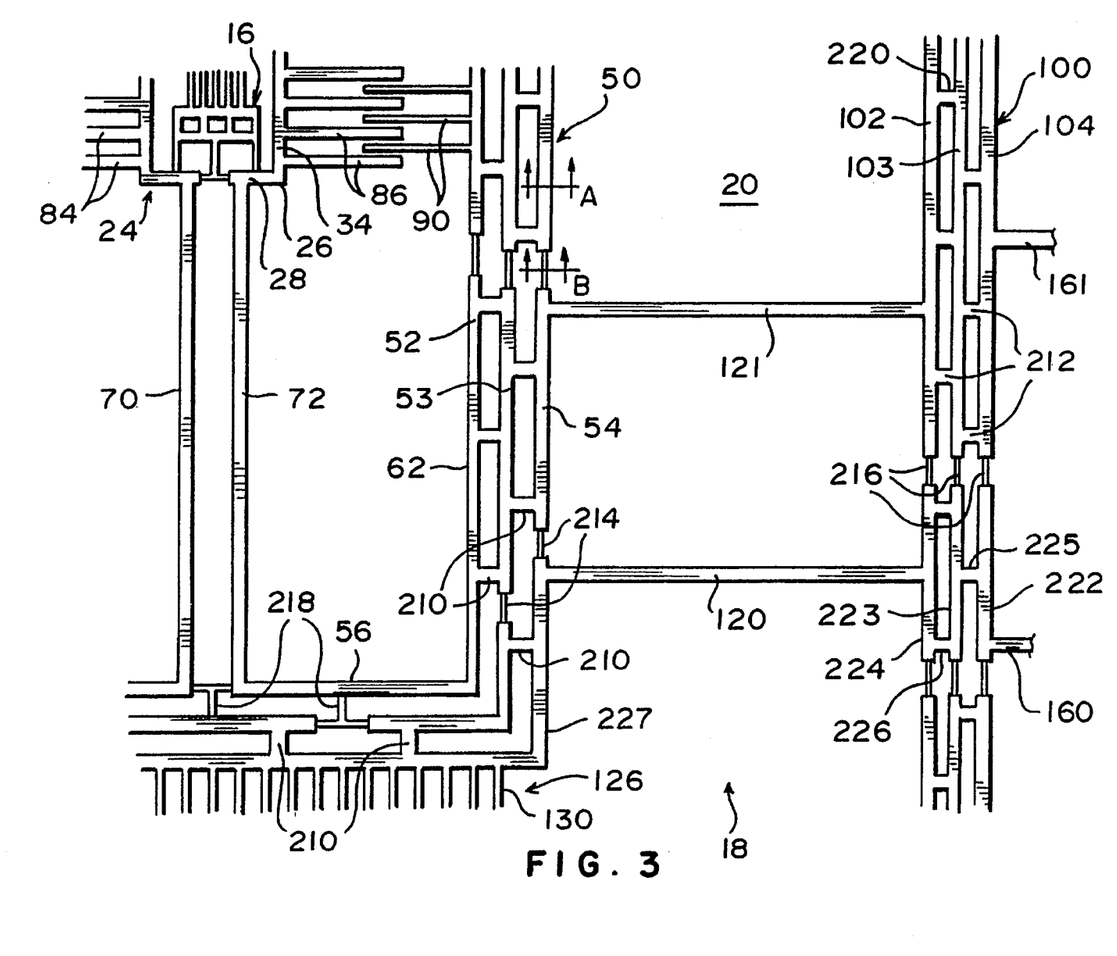
FIG. 3 is an enlarged partial view of the microactuator assembly of FIG. 1, showing portions of the central stage and x, y, and z support stage assemblies.

As illustrated diagrammatically in FIG. 1 and in greater detail in the enlarged view of FIG. 3, the circumferential beams 52–54 which make up frame 50 are interconnected by way of mechanically supportive bridge connectors such as those illustrated at 210. These bridge connectors are fabricated integrally with the circumferential beams 52, 53, and 54 and are mechanically strong to provide a rigid frame structure, as well as to provide electrical connection between the circumferential beams. In similar manner, the circumferential beams 102–104 which make up frame 100 are mechanically and electrically interconnected by bridge connectors such as those illustrated at 212, to make a rigid frame structure.

The inner ends of suspension beams 140–142, 144–146, 154–157, and 160–163 are mechanically connected at spaced locations to the outer frame 100, and preferably are integral therewith, to suspend the frame, and thus the entire actuator assembly 10, within cavity 14 and spaced above floor 20. These suspension beams provide electrical connections between the connector pads on the substrate and the frame 100, and are electrically connected to the outer drive plates 134, 136 of capacitors 126 and 128 or through selected inner conductor beams to the inner frames and to the central stage. Although these suspension beams are illustrated as being single beams, it will be apparent that they can be fabricated as multiple parallel beams interconnected by bridges spaced to provide the desired rigidity or flexibility.

The plural circumferential beams making up each of the inner and outer frames 50 and 100 and the interconnecting bridges 210 and 212 which mechanically strengthen the frames, are normally electrically conductive, and thus can be used to conduct electrical signals from exterior circuitry to selected components of the actuator assembly. Electrically insulating segments such as segments 214 and 216 in frames 50 and 100, respectively, selectively divide the circumferential beams into plural isolated electrical segments. Further, selected bridges such as those illustrated at 218 and 220 are also electrically insulating, and cooperate with insulating segments in the circumferential beams to define isolated electrical paths by which each of the outer conductors can be connected to a preselected component of the assembly. For example, outer suspension beam 160 can be connected through selected segments 222–224 and bridges 225 and 226 of frame 100, support beam 120 and segment 227 of beam 54 of frame 50 for electrical connection to the drive capacitor plates 130 on frame 50. Similarly, outer suspension beam 142 can be connected through selected segments of beams 102–104 making up the outer frame 100 and through selected bridges to capacitor plates 134 interleaved with the aforementioned plates 130. Another suspension beam 161 can be connected to the capacitor plates 86 on frame 24, as through selected segments of frames 50 and 100 and corresponding connector beams 121 and 72, and so on. By careful design and positioning of insulating segments, electrical connections can be made as required to activate the compound stage actuator device of the invention to move the central stage 16 in three directions. Similar connections to capacitive plates on the floor and walls of the cavity and on frame 100 can provide three directions of rotational motion.

The central stage may support a variety of components, including various sensors or, in one embodiment, an array 230 of field emission cathodes 22 for use in vacuum microelectronic devices and applications. Such emitters are electrically connected to external circuitry through the connector beams and frame segments as described above. These beams and frame segments are resistive, and thus function as series emitter resistors to limit sharp rises in current not only to protect the emitter cathodes, but to provide improved uniformity of emission where a plurality of such cathodes are provided. In one embodiment of the invention, the central stage 16 was capable of scanning a 20×20 micrometer area in the x-y plane and was capable of moving up and down ±500 nm. Further, it was capable of operating at scan rates of greater than 20 kHz.

A process for fabricating the single crystal silicon actuator 10 described above is outlined in diagrammatic tabular form in FIGS. 4(a)–4(j) which illustrate the effect of the process steps at different cross sectional regions of the actuator structure. Cross section A illustrates the various electrically conductive beams or beam segments, such as the circumferential beams 52–54 and 102–104, as well as the suspension beams securing the frame 100 within cavity 14, the connector beams between frames, the bridges, the various capacitor plates, etc. This cross section may be taken, for example, at A in FIG. 3 on beam 54. In similar manner, cross section B, also found in FIG. 3 on beam 54, illustrates the cross sectional region of beam segments which are to be completely oxidized during the process to form insulating segments. Cross section C at connector pad 172 in FIG. 1, is an illustration of the process for fabricating a silicon on insulator (SOI) connection between the suspension beams and connector pads formed on the substrate.

Figures 4A, 4B, 4C:
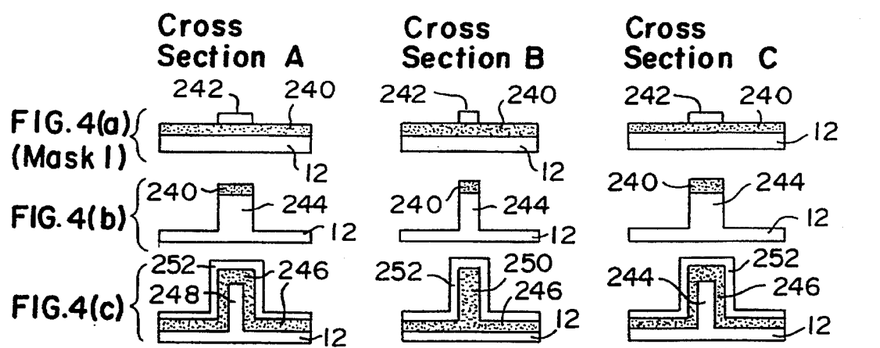
FIGS. 4(a) through 4(j) illustrate in tabular form a process for fabricating the microactuator of FIG. 1 at representative cross-sections A, B, and C thereof.

The starting substrate 12 is an arsenic-doped 0.005 ohm-cm, n-type, (100) silicon wafer. A layer 240 of silicon dioxide, preferably 500 nm thick, is thermally grown on this silicon substrate in a pyrogenic steam oxidation at 1100° C., and is used as an etch mask, identified in FIG. 4(a) as mask 1. The pattern for producing the released single crystal silicon structure is created using a photolithographic techniques. To obtain nanometer-scale feature sizes by this process, a contrast-enhancement material is used with KTI-OCG 895i 5cs photoresist such as the photoresist layer 242 for patterning. This photoresist material is spun on the top surface of the silicon dioxide layer 240 at 6 krpm to a thickness of 0.5 micrometers. The desired pattern for the actuator assembly 10 is then used for a photolithographic exposure of the photoresist material, defining the desired width and length of each of the components of the actuator. As illustrated in FIG. 4(a), the pattern line width of the structural beams is about 500 nm, as illustrated at cross section A, while the pattern line width for those beam segments which are to provide oxide isolating segments is about 200 nm, as illustrated at cross section B.

The photoresist pattern 242 is transferred to the silicon dioxide layer 240 in a $CHF_3/O_2$ plasma etch at flow rates of 30 sccm/0.5 sccm at a chamber pressure of 30 mTorr and a DC bias of −440 volts in a custom parallel plate RIE system. The etch rate of the silicon dioxide is 230 nm per minute. Thereafter, the photoresist is stripped by an $O_2$ plasma etch. After the photoresist is stripped, the resulting silicon dioxide pattern is transferred to the silicon substrate, in the manner illustrated in FIG. 4(b), using a $Cl_2$-RIE. The $Cl_2$ etching removes any organic residue and native oxide on the silicon surface, and thereafter a silicon etch is performed in a $Cl_2/BCl_3$ plasma etch at flow rates of 49 sccm/7 sccm at a chamber pressure of 20 mTorr and a DC bias of −400 volts. The depth of the silicon etch illustrated in FIG. 4(b) is 3 micrometers, leaving mesas, or islands, 244 which are to become the various beams and bridges of the actuator. A 310 nm thick silicon dioxide layer 240 is left on top of the etched silicon lines 244.

Following the silicon etch, a sidewall silicon dioxide layer 246 is thermally grown to a thickness of 250 nm in a steam $O_2$ ambient at 1000° C., as illustrated in FIG. 4(c). The width of the mesas 244 are reduced due to the consumption of silicon during the oxidation step, so that the wider mesas are reduced, as indicated at 248 in cross sections A and C, and the narrower line segments (initially 200 nm wide) are fully oxidized, as illustrated at 250 in FIG. 4(c), cross section B. As noted above, the narrower line segments can be placed at any desired location within the actuator to provide the desired oxidized segments for electrical insulation, these segments still being sufficiently wide to provide the required mechanical connection and strength for the structure. The oxidized segment 250 may correspond, for example, to the segments 214, 216, 218, and 220 illustrated in FIG. 3.

As also illustrated in FIG. 4(c), a 100 nm layer of LPCVD silicon nitride 252 is conformally deposited on the silicon dioxide layer 246. This silicon nitride ($Si_3N_4$) serves as an oxidation mask to protect the beam structure during subsequent oxidation steps which occur during the formation of the SOI structures.

In some cases, the demands of the structural design may require that the beam width be greater than that which will permit complete oxidation during the steps illustrated at FIG. 4(c), yet complete oxidation is required for isolation at that location. In such a case, the isolation process described above is followed by a selective oxidation step before the SOI structure is formed. In this case, a dielectric stack of nitride/oxide (100 nm/100 nm) is deposited by LPCVD and PECVD. The nitride on the top and upper part of the sidewalls of the silicon segments which are to be oxidized is selectively stripped, using an oxide etch mask, by hot (160° C.) phosphoric acid solution to provide an oxidation window opening which allows the silicon segments to be fully oxidized, while the structural base-silicon is not oxidized. This is followed by a second thermal oxidation to completely oxidize the selected segments, and a conformal layer of silicon nitride is provided to cover the window.

Figure 4D:
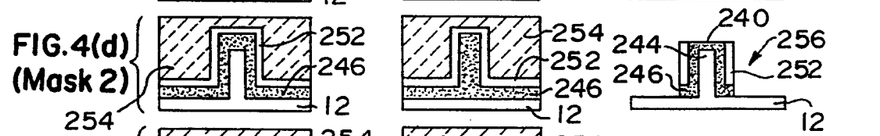

Thereafter, as illustrated in FIG. 4(d) a photoresist layer 254 is spun on the silicon nitride layer 252, for example, at 2.50 krpm in 60 seconds to a thickness of 3.5 micrometers, as illustrated in FIG. 4(d), cross sections A and B. A second mask is then used to pattern the desired SOI structures in the photoresist material, this pattern being generally indicated at 256 in FIG. 4(d), cross section C, taken at the edge 150 of substrate 12, as illustrated in FIG. 1. This SOI structure is used to mechanically connect a beam to the substrate and to provide an electrical connection between the beam (such as beam 142 in FIG. 1) and its corresponding conductive pad 172, so that a connection can be made to circuitry on the substrate or at some other desired location. The pattern 256 of the SOI structures defines each of the connectors at the outer ends of suspension beams 140–142, 144–146, 154–157, and 160–163.

After the pattern has been defined in the photoresist, as through a photolithographic exposure, the nitride/oxide exposed by the pattern is vertically etched back with $CHF_3/O_2$ plasma etch, again as illustrated at cross section C in FIG. 4(d). The vertical etch removes the dielectric stack on horizontal surfaces, for example at the base of the mesa 244 (cross section C) while leaving at least some of the silicon dioxide mask 240 on the top of mesa 244 and the silicon dioxide 246 on its sidewalls, while also leaving the silicon nitride 252 on the sidewalls.

Figures 4E, 4F, 4G:
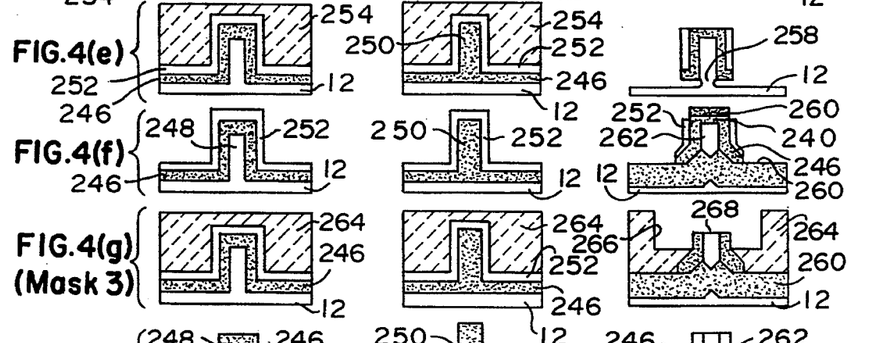

The next step in the process is an isotropic silicon recess etch, illustrated at FIG. 4(e), which is performed using a fluorinated silicon ($SF_6$) RIE. This recess etch, illustrated at 258 (in FIG. 4(e), cross section C) removes silicon from the top layer of substrate 12 and etches under the edges of the sidewall nitrate 252 to produce the undercut region 258. This recess etch enhances the lateral oxidation at the base of the silicon line 244 during the subsequent oxidation step by increasing the transport of oxidizing species underneath the single crystal silicon line. This recess etch has no effect at cross sections A and B.

The photoresist layer 254 which had been used to protect the beam structures is then stripped by an $O_2$ plasma etch, as illustrated in FIG. 4(f) and an 1100° C. pyrogenic steam oxidation is performed to grow a 700 nm thick field oxide 260 which laterally undercuts the single crystal silicon line 244 at cross section C, thereby producing the isolated beam segment 262 (FIG. 4(f) at cross section C), which beam section may be a part, for example, of suspension beam 142 in FIG. 1. The single crystal silicon lines 248 and 250 at cross sections A and B are protected from the oxidation step by the silicon nitride layer 252.

Following the oxidation step of FIG. 4(f), metal-contact windows are opened on the top of the single crystal silicon lines, where required, and over corresponding contact pads previously formed in the surrounding silicon Wafer 12. Such contact pads in the wafer may have been fabricated during the formation of electrical circuits on the surface of the wafer, the pads being covered by a layer of oxide prior to formation of the actuator 10. In step 4(g), such pads may be exposed by the window mask (Mask 3) formed by conventional photolithography in a photoresist layer 264. For such metal-contact window patterning, the photoresist on top of the beam 262 is exposed through its complete thickness, while the resist material to the sides of the beam region is sufficiently thick to prevent exposure completely through the photoresist. Therefore, the exposed photoresist is completely developed away on top of beam 262, as at region 266 (FIG. 4(g), cross section C) so that the silicon dioxide layers 240 and 260 on top of the silicon beam 262 are etched using $CHF_3/O_2$ plasma etch to reveal the top surface 268 of beam 262. In similar manner, the contact pad for this beam may also be opened, after which the photoresist 264 is stripped away using an $O_2$ plasma etch. Thereafter, the silicon nitride layer 252 is stripped, using hot phosphoric acid at 160° C., as illustrated in FIG. 4(h).

Metallization of the metal contact window is completed by an aluminum lift off using a tri-layer resist process. A 300 nm layer of aluminum is applied, using mask 4 (FIG. 4(i)), the aluminum layer 270 conformally covering the SOI structure 262. A DC magnitron sputter deposition process may be used to provide the layer 270 (cross section C). A metal etch step is then used to remove excess metal.

The silicon dioxide 246 on the horizontal surface of substrate 12 at the base of the lines 248 and 250 is then removed by a second etch back using $CHF_3/O_2$ plasma etch. The thicker field silicon dioxide remains on the top surface of the lines 248 and on the sidewalls thereof, while the aluminum layer 270 protects the oxide layer 260 beneath the beam 262 (cross section C). Finally, the lines 248 and 250 are completely released from the silicon substrate 12 using an $SF_6$ RIE process in the same etch conditions as were used in the silicon recess etch, thereby providing released beam 248 and released beam 250, illustrated in FIG. 4(j) at cross sections A and B. It is noted that the beam 248 is protected by the silicon dioxide layer 246 during this last release step. The beam 248 thus corresponds to the silicon beams utilized in the actuator assembly 10, as discussed above. The silicon dioxide layer 260 for the SOI structure is not etched, leaving the SOI structure clamping the ends of the beams to the substrate.

Figures 4H, 4I, 4J:
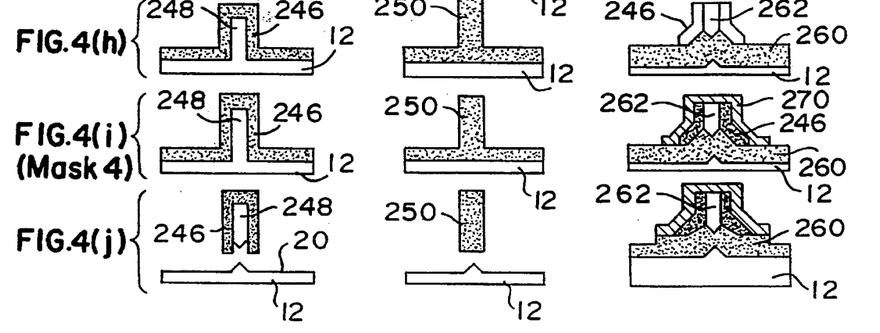
Figures 5, 6:
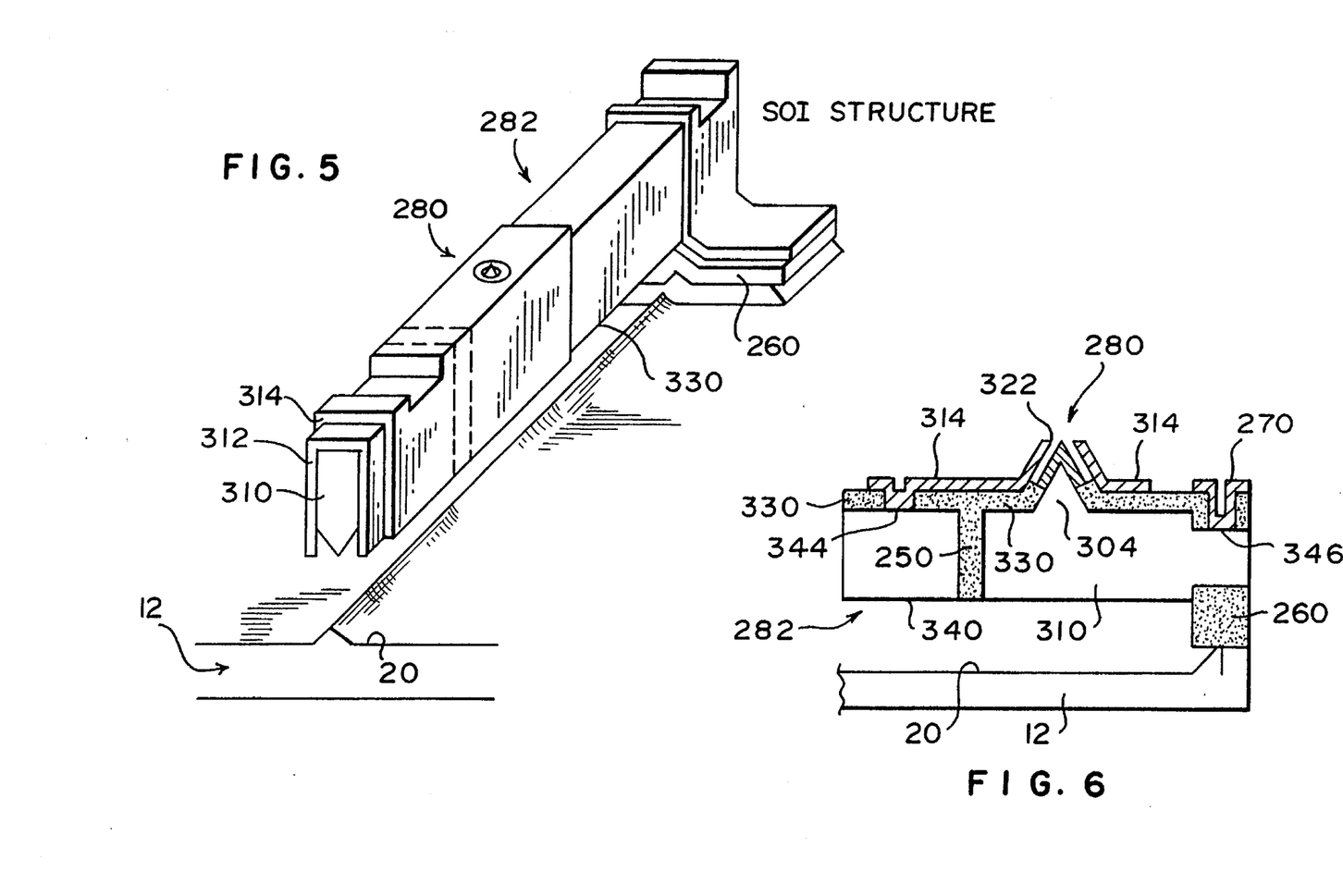
FIG. 5 is a perspective enlarged view of an emitter for the central stage of the microactuator.
FIG. 6 is a cross-sectional view of the emitter of FIG. 5.

As illustrated in FIGS. 5 and 6, released silicon beams such as the beams 248 illustrated at cross section A in FIG. 4(j) can incorporate one or more field emission cathodes, such as the cathode 22 illustrated in FIG. 2. A single such cathode is illustrated in FIG. 5 at 280, this cathode being formed on a beam 282 which may, for example, be one of the beams forming a part of central stage 16 and illustrated in FIG. 2.

FIGS. 7(a) to 7(j) illustrate a process for building a gated field emitter on a high aspect ratio silicon structure with submicron lateral feature size. The silicon base for the emitter can be released or unreleased; in the illustrated embodiment of FIGS. 7(a)–7(j) the base is unreleased, but the process can be combined with that described above for actuator 10 to provide emitters on released beams, as will be described below.

Figure 7A:
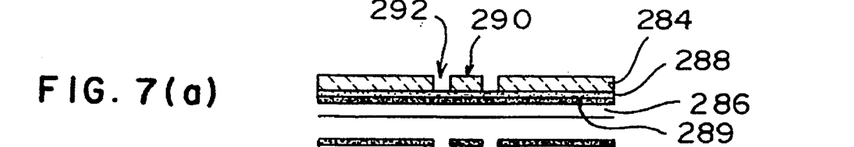
FIGS. 7(a)–7(j) illustrate in tabular form a process for fabricating a fully self-aligned gated field emitter integrated on a silicon beam.

To form a tip for an emitter, a 350 nm thick layer 284 of P(MMA-MAA) (9%) copolymer resist on a substrate 286 and dielectric layer 288 and 289 is electron-beam exposed in a Cambridge Instruments EBMF-10.5/CS system at 20 kV beam energy and 1.5 nA beam current on a 1.6384 mm exposure field (see FIG. 7(a)). The tip is defined by a 500×500 $nm^2$ island 290 surrounded by a 150 nm wide trench 292. The pattern in the developed electron-beam resist is transferred to underlying dielectric films of plasma enhanced chemical vapor disposition (PECVD) oxide 288 (100 nm) and low pressure chemical vapor deposition (LPCVD) nitride 289 (100 nm) using $CHF_3/O_2$ RIE, and then to the substrate-silicon 286 using $SF_6$ RIE (see FIG. 7(b)). The silicon etch produces a 1 μm deep trench 294 with 200 nm lateral undercut under the oxide film 288, which is used as an etch mask, and produces a central island 295.

Figures 7B, 7C:
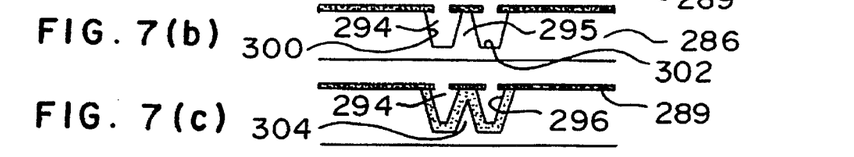

A 100 nm thick oxide layer 296 thermally grows on the exposed silicon (see FIG. 7(c)). The nitride film 289 that remains from the previous silicon etch step serves as an oxidation mask. This oxidation step provides an oxide layer which reduces the size of island 295 as well as the sidewalls 300 and bottom 302 of the silicon trench to produce silicon tip 304, which is sharpened and, thereby, has a thicker oxide covering on the tip apex due to the isotropic reduction of the dimensions by consumption of some of the surface silicon.

Figure 7D:
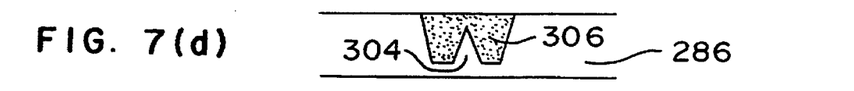
Figure 7E:
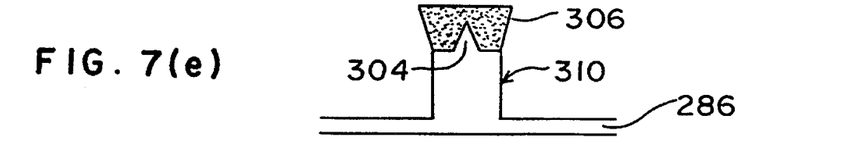

After the oxidation step, a planarization process is used to completely fill the silicon trench 294 (see FIG. 7(d)) with oxide 306. The planarization process is performed with alternative deposition and vertical etchback of PECVD oxide and planarizing material (KTI-OCG photoresist), and is finished by removing the dielectric stack, including nitride 289, covering over the substrate-silicon. The oxide 306 in the trench and covering over the silicon tip is used for a subsequent silicon etch mask to redefine the silicon emitter base-structures.

A silicon structural beam having a width of 800 nm to support tip 304 is required by the 300 nm trench patterning and the tip etch and oxidation described above. To produce such a beam, silicon 286 is vertically etched back past the level of the trench bottom 302, and then down 3 μm to form the beam structure 310 by a $Cl_2/BCl_3$ RIE etch (see FIG. 7(e)).

Following the silicon etch, the oxide etch mask 306 is stripped off using buffered hydrofluoric acid solution. A 250 nm thick oxide film 312 is provided to conformally cover beam 310 and tip 304 by depositing PECVD oxide (see FIG. 7(f)). The following gate-electrode metallization is performed on the oxide film with a conformal, rather than a level, coating.

Figure 7F:
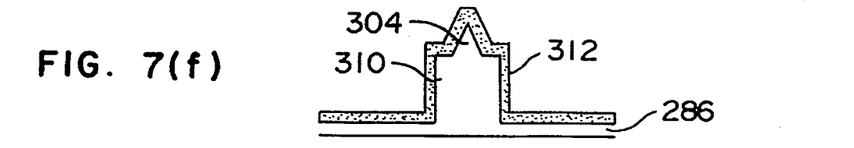
Figure 7G:
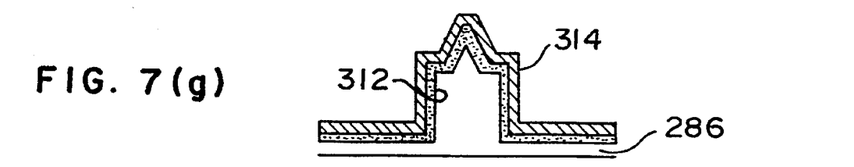
Figure 7H:
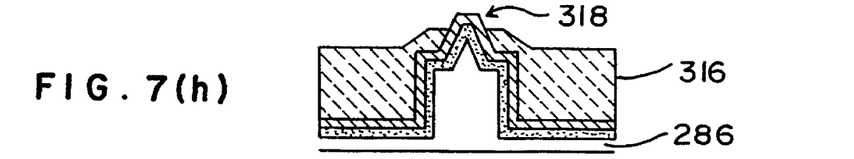
Figure 7I:
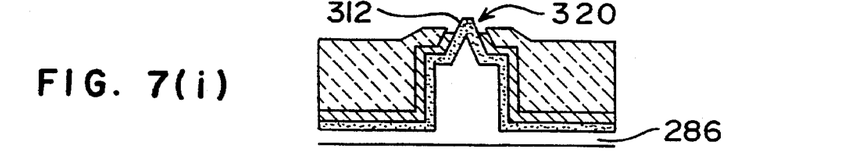
Figure 7J:
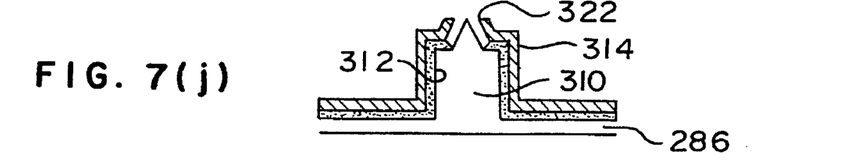

A sputtered $Ti_{0.1}W_{0.9}$ film 314 is deposited on the oxide film (see FIG. 7(g)). A 3.5 μm thick planarizing material 316 (KTI-OCG 895i 50cs photoresist) is spun on the $Ti_{0.1}W_{0.9}$ film, the thickness of the photoresist corresponding to the 3 μm height of the structure 310, 304 (see FIG. 7(h)). The photoresist directly above the tip apex is thinner than over the remainder of the surface. An $O_2$ plasma etchback exposes the $Ti_{0.1}W_{0.9}$ layer 314 above the apex, at 318. The exposed $Ti_{0.1}W_{0.9}$ is then etched using an $SF_6$ RIE, most of the $Ti_{0.1}W_{0.9}$ lying underneath the photoresist being protected by the photoresist (see FIG. 7(i)), as indicated at 320. This etch does not affect the oxide. The oxide 312 covering the tip is then removed using buffered hydrofluoric acid solution. The remaining photoresist 316 is stripped off (see FIG. 7(j)), leaving the metal layer 314 surrounding the tip 304 and providing a gate electrode aperture 322 for the tip. The electrode preferably has a gate aperture diameter of about 500 nm, but the diameter of aperture 322 can range from 200 to 800 nm. The aperture diameter is determined, in part, by the thickness of the conformal oxide film 312.

Although the emitter fabrication process described above can be used separately, it can also be fully integrated into the microelectromechanical actuator 10 of the present invention, to provide, for example, emitters on submicrometer wide beams in the center stage portion 16.

The integrated process starts with the arsenic-doped, 0.005 Ω cm, n-type, (100) silicon substrate 12 (or 286, as shown in FIG. 7(a)) on which there are 100 nm thick films of nitride 289 and oxide 288 deposited. The first stage in forming the silicon structures is to produce the 1 μm height silicon tips by producing 1 μm deep trenches 294, as shown in FIG. 7(b), as by electron-beam lithography and oxide/nitride etch and silicon etch. The trench widths range from 150 to 250 nm. In addition, 150 nm wide trenches can also be provided where desired to form 300 nm wide, suspended oxide segments (such as segment 250 in FIGS. 5 and 6) to electrically isolate suspended silicon segments. A 100 nm film 296 of thermal oxide covers the tips and the bottom and sidewalls of the trenches by an oxidation step. The thermal oxidation step further sharpens the tips and provides thicker oxide on the apexes. A planarization process is performed to fill PECVD oxide in the trenches. These process steps are referred to in the process outline shown in FIG. 7(a) to (e).

The second stage of the integrated process is forming high aspect-ration silicon structures, either with or without emitters. The entire actuator structure is defined by the pattern in the oxide filling in the trenches and covering over the tips in FIG. 7(d) and covering the substrate in FIG. 4(a) (cross sections A, B, and C). A $Cl_2/BCl_3$ RIE is performed to etch silicon 3 µm deep using the oxide as an etch mask.

A 100 nm thick film of LPCVD nitride 252 and 312 in FIGS. 4(c) and 7(f), respectively, selectively and conformally covers the beams, including the portion of the structures on which the tips are located. This nitride film is used to protect the tips during subsequent isolation process implementation.

The integrated process continues with isolation and metallization processes as shown in FIGS. 4(d) to 4(j) to produce the composite XYZ stages with the integrated electro-mechanical sensors and actuators. The suspended silicon structural beams for the emitters are 800 nm wide and 3 µm thick, and are coated by conformal oxide film.

Figure 8A:
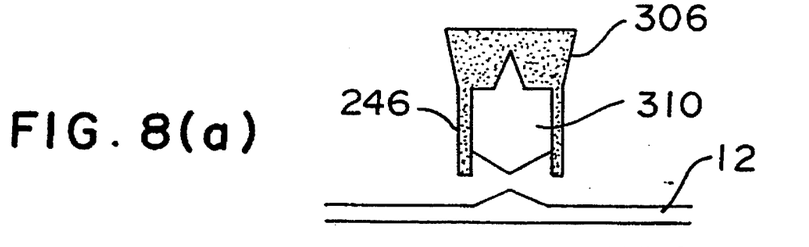
FIGS. 8(a)–8(e) illustrate in tabular form a process for fabricating a fully self-aligned gated field emitter integrated on a released silicon beam.
Figure 8B:
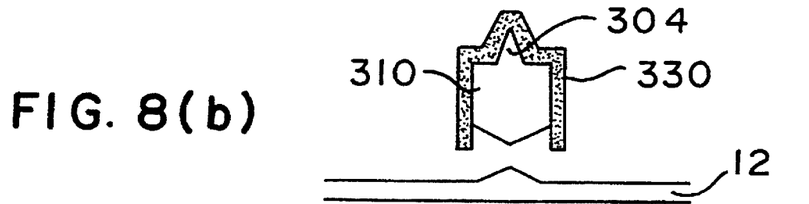
Figure 8C:
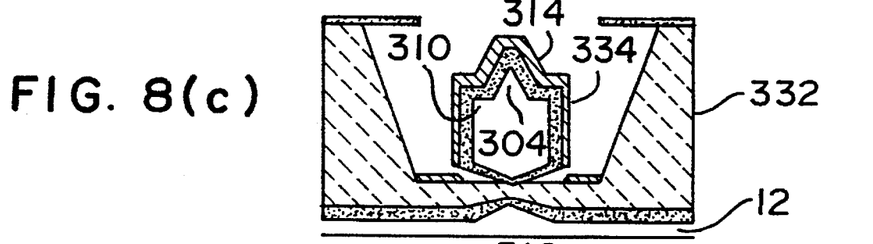
Figure 8D:
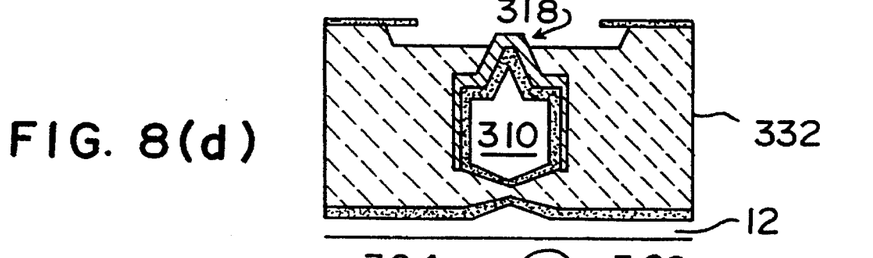

After the beam structures are released (see FIG. 4(j), cross-section A, B, and C) and FIG. 8(a), the oxide 246 and 306 on the portion of the structures with integral silicon tips is etched away and a new conformal oxide 330 is deposited (see FIG. 8(b)). The metallization process of the integrated emitter gates is performed, as outlined in FIGS. 7(g)–7(j), except that it is performed on a released beam 310. The pattern of the gate electrodes is created using trilayer resist, photolithography and metal (e.g. sputter $Ti_{0.1}W_{0.9}$) liftoff. The trilayer resist consists of 4 µm photoresist (KTI-OCG), 100 nm PECVD oxide (deposited at 90° C.) and 500 nm photoresist. The pattern in the developed photoresist is tranferred into the oxide by $CHF_3/O_2$ RIE, and then into the base photoresist 332 by $O_2$ RIE. The base photoresist is etched by $O_2$ RIE until most of the vertical sidewalls 334 of the released structure 310 is exposed (see FIG. 8(c)). After the metal 314 is deposited on the oxide/photoresist stack the excess is "lifted off" by using acetone to dissolve the photoresist. Windows for gate aperture openings are defined in redeposited trilayer resist by photolithography and RIE etches of oxide and base photoresist. The $O_2$ RIE etch is stopped once the gate metal above the tip apexes is exposed (see FIG. 8(d)), the metal is etched, and the oxide covering over the silicon tips and the remaining base photoresist are removed by buffered hydrofluoric acid solution and $O_2$ RIE, respectively (see FIG. 8(e)), to provide a gate aperture surrounding a tip on a released beam.

Figure 8E:
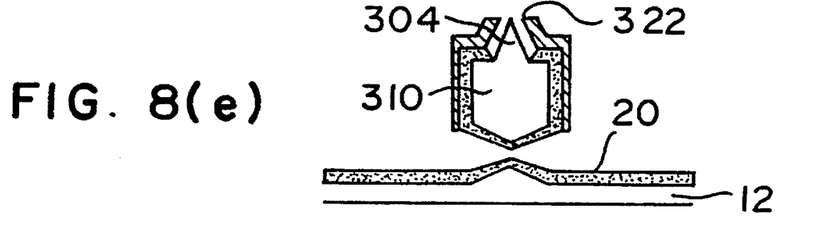

As illustrated in FIGS. 5 and 6, such a released beam 282 may incorporate a silicon core 310, similar to the beam in FIG. 8(e), which is released from the floor 20 of substrate 12 in the manner described above. Core 310 is covered by a silicon dioxide layer 330 and may incorporate, for example, one or more oxide segments 250 which electrically insulate regions of the beam 282, such as region 340 from adjacent regions of that beam, such as region 342. An oxide conformal layer 330 is provided on the surface of core 310 in the region of the emitter 280, to insulate the metal gate electrode layer from the silicon core.

The metal gate electrode 314 contacts the silicon core 310 in regions 340 through a window 344 formed in oxide layer 286, while the emitter tip 304 is connected by way of beam portion 342 and window 346 to metal layer 270 (see FIG. 4(j), Section C) at the substrate to which the beam 282 is connected. In this case, the substrate is the center stage 16 of the actuator, through which electrical connections are made through conductive paths in the actuator beam structure. Similarly, beam section 340 can be connected to an SOI section at the opposite side of stage 16 (see FIG. 2).

The integrated, mechanically scannable field emission cathode array 230 offers unique capabilities for vacuum microelectronic devices and applications. By selectively connecting the conductive cores 310 of the beams in the stage 16 to corresponding connector pads on the surrounding substrate by way of conductive paths defined in the frames and their interconnect structures, the field emitters can be activated individually or in groups. As noted above, the conductive beams serve as series emitter resistors to limit sharp rises in emission current to thereby protect the cathodes and improve uniformity of emission.

Although the present invention has been described in terms of preferred embodiments, it will be apparent that numerous modifications and variations may be made without departing from the true spirit and scope thereof, as set forth in the following claims.

What is claimed is:

1. A process for fabricating a microcathode field emitter on a movable microactuator stage, comprising:

defining, in a top surface of a silicon substrate an upwardly extending island surrounded by a first trench;

thermally growing a first oxide layer within the trench, the oxide consuming substrate material to reduce the island and produce a sharpened tip at the top of the island and within the trench;

filling the trench with oxide;

etching said substrate to form second trenches on opposite sides of said tip to define a structural beam which includes said tip;

covering said beam and included tip with a second oxide layer;

metallizing said beam and included tip;

etching said metal in a region of said tip to produce an aperture surrounding said tip and exposing said second oxide layer; and removing said second oxide layer in the region of said tip.

2. The process of claim 1, further including, before the step of metallizing, selectively and conformally covering said beam and included tip with a nitride layer;

vertically etching the nitride layer and the substrate material at a base of the beam;

performing a recess etch at the base of the beam; and laterally oxidizing the substrate under the beam to release the beam and included tip.

3. The process of claim 2, wherein the step of etching said substrate to define a structural beam further includes etching said substrate to define first and second frames mechanically connected to said structural beam, and wherein performing a recess etch at the base of the beam and laterally oxidizing the substrate under the beam includes recess etching and lateral oxidizing said first and second frames, to release said beam and said frames for relative motion with respect to said substrate, said frames supporting said beam and tip for relative motion as a movable stage about an x-axis and a y-axis.

* * * * *